(12) United States Patent
Tao et al.

(10) Patent No.: US 10,886,266 B1
(45) Date of Patent: Jan. 5, 2021

(54) INTEGRATION OF VERTICAL GAN VARACTOR WITH HEMT

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/511,099

(22) Filed: Jul. 15, 2019

(51) Int. Cl.
| | |
|---|---|
| *H01L 27/06* | (2006.01) |
| *H01L 29/93* | (2006.01) |
| *H01L 29/778* | (2006.01) |
| *H01L 29/20* | (2006.01) |
| *H01L 29/205* | (2006.01) |
| *H03F 3/195* | (2006.01) |
| *H01L 29/66* | (2006.01) |
| *H01L 21/02* | (2006.01) |

(52) U.S. Cl.
CPC ...... *H01L 27/0629* (2013.01); *H01L 21/0254* (2013.01); *H01L 27/0605* (2013.01); *H01L 29/2003* (2013.01); *H01L 29/205* (2013.01); *H01L 29/66174* (2013.01); *H01L 29/66196* (2013.01); *H01L 29/66462* (2013.01); *H01L 29/7786* (2013.01); *H01L 29/93* (2013.01); *H03F 3/195* (2013.01); *H03F 2200/297* (2013.01); *H03F 2200/451* (2013.01)

(58) Field of Classification Search
None
See application file for complete search history.

(56) References Cited

U.S. PATENT DOCUMENTS 5,705,847 A * 1/1998 Kashiwa ............ H01L 21/8252
257/471
2014/0110761 A1 4/2014 Yang et al.
(Continued)

FOREIGN PATENT DOCUMENTS

JP 2002026253 A 1/2002

OTHER PUBLICATIONS

Preis, F. Lenze, A. Wiens, R. Jakoby, W. Heinrich and O. Bengtsson, "Reconfigurable packaged GaN power amplifier using thin-film BST varactors," 2017 47th European Microwave Conference (EuMC), Nuremberg, 2017, pp. 140-143, doi: 10.23919/EuMC.2017. 8230819. (Year: 2017).*

(Continued)

*Primary Examiner* — J. E. Schoenholtz
(74) *Attorney, Agent, or Firm* — Withrow & Terranova, PLLC

(57) ABSTRACT

Aspects generally relate to a P⁻N junction varactor that can be integrated with high electron mobility transistor (HEMT) in a single device or die. The varactor and HEMT are fabricated with different materials forming various layers of the varactor and HEMT. Using different material stack-up to form the varactor and HEMT allows characteristics of the varactor and HEMT to be varied for improved performance in different operating scenarios. The integrated varactor and HEMT device may be used for RF circuits, such as radio frequency front end (RFFE) devices for use in 5G.

16 Claims, 13 Drawing Sheets

(56) References Cited

U.S. PATENT DOCUMENTS

2014/0117411 A1* 5/2014 Kanaya ............... H01L 27/0605
257/195
2017/0170233 A1 6/2017 Tsai et al.
2018/0337271 A1 11/2018 Kotani et al.

OTHER PUBLICATIONS

C. Kong, H. Li, S. Jiang, J. Zhou, X. Chen and C. Chen, "A monolithic AlGaN/GaN HEMT VCO using BST film varactor," 2011 IEEE International Symposium on Radio-Frequency Integration Technology, Beijing, 2011, pp. 197-200, doi: 10.1109/RFIT. 2011.6141794. (Year: 2011).*
C. Kong, H. Li, X. Chen, S. Jiang, J. Zhou and C. Chen, "A Monolithic AlGaN/GaN HEMT VCO Using BST Thin-Film Varactor," in IEEE Transactions on Microwave Theory and Techniques, vol. 60, No. 11, pp. 3413-3419, Nov. 2012, doi: 10.1109/TMTT. 2012.2209442. (Year: 2012).*
M. Marso, M. Wolter, P. Javorka, A. Fox and P. Kordos, "AlGaN/ GaN varactor diode for integration in HEMT circuits," in Electronics Letters, vol. 37, No. 24, pp. 1476-1478, Nov. 22, 2001, doi: 10.1049/el:20011007. (Year: 2001).*
Jahan F., et al., "RF power limiter using capacitively-coupled contacts III-nitride varactor," Electronics Letters, Nov. 8, 2012, vol. 48, No. 23, 2 pages.
Mutamba K., et al., "Technology of Wide-Bandgap Diode Structures for Highfrequency Operation," International Semiconductor Conference, IEEE, 2006, pp. 85-92.

Amirpour R., et al., "Dynamic Load Modulated Low-Voltage GaN PA Using Novel Low-Loss GaN Varactors", 2018 18th European Microwave Conference (EUMC), European Microwave Association, Sep. 25-27, 2018, Madrid, Spain, Sep. 23, 2018 (Sep. 23, 2018), XP033450434, pp. 5-8, DOI: 10.23919/EUMC.2018. 8541639 [retrieved on Nov. 20, 2018], Sections I, III, Figure 5.
Hamdoun A., et al., "Characterization of GaN-Based HEMTs as Varactor Diode Devices", 2015 10th European Microwave Integrated Circuits Conference (EUMIC), EUMA, Sep. 7-8, 2015, Paris, France, Sep. 7, 2015 (Sep. 7, 2015), XP032823276, pp. 417-420, DOI:10.1109/EUMIC.2015.7345158 [retrieved on Dec. 2, 2015], Section VII.
International Search Report and Written Opinion for International Patent Application No. PCT/US2020/070090, dated Sep. 30, 2020, 18 pages.
Mahaboob I., et al., "Dynamic Control of AlGaN/GaN Hemt Characteristics by Implementation of a p-GaN Body-Diode-Based Back-Gate", IEEE Journal of the Electron Devices Society, vol. 7, May 24, 2019 (May 24, 2019), KP011726901, pp. 581-588, DOI: 10.1109/JEDS.2019.2915097 [retrieved on May 23, 2019], Sections II, III.A, IV, Figures 1, 4.
Marso M., et al., "Comparison of AlGaN/GaN MSM Varactor Diodes Based on HFET and MOSHFET Layer Structures", Annual India Conference, 2006, IEEE, PI, Oct. 2006 (Oct. 2006), XP031062279, pp. 229-232, DOI: 10.1109/ASDAM.2006.331195, ISBN: 978-1-4244-0369-1, Section "1. Introduction", Figure 1.
Xu H., et al., "Integration of $Ba_xSr_{1-x}TiO_3$ Thin Films with AlGaN/GaN HEMT Circuits", IEEE Electron Device Letters, IEEE, vol. 25, No. 2, Feb. 2004 (Feb. 2004), XP011106285, pp. 49-51, ISSN: 0741-3106, DOI:10.1109/LED.2003.822672, Sections 1, 4, Figure 1.

* cited by examiner

INTEGRATION OF VERTICAL GAN VARACTOR WITH HEMT

BACKGROUND

I. Field of the Disclosure

Aspects of the disclosure relate generally to integrated circuits, and in particular, to integration of vertical GaN varactors with high electron mobility transistors (HEMT).

II. Background

As mobile devices, such as smart phones, continue to evolve, the need for improved radio frequency (RF) performance increases. For example, as wireless technology migrates from third generation (3G), to fourth generation (4G) or long term evolution (LTE), to fifth generation (5G) RF requirements continue to become more demanding due to having to support wider bandwidth and higher frequency bands, such as sub 6 GHz and millimeter wave signals.

RF components in mobile devices include RF front end (RFFE) circuits can include power amplifiers and filters that are separate components. Modern RFFE components typically include III-V type devices, such as GaN high electron mobility transistors (HEMT). RFFE components also typically include capacitive tuning circuits, such as varactors, to provide filtering and matching circuitry for power amplifiers.

It would be beneficial to more tightly integrate HEMT devices with varactors.

SUMMARY OF THE DISCLOSURE

The described aspects generally relate to integrating varactors and high electron mobility transistors (HEMT) in a single device or die.

Aspects include an integrated circuit including a varactor and a high electron mobility transistor (HEMT) in the same device or die. The varactor and HEMT are fabricated with different layers formed in the integrated circuit. In the following description, when a substance has been lightly doped with an N dopant the chemical compound is proceeded with a $N^-$, when a substance has been heavily doped with a N dopant the chemical compound is preceded with the notation $N^+$, and when a substance has been doped with an N dopant to a normal, or average level, the chemical compound is preceded with the notation N. Likewise, when a substance has been lightly doped with an P dopant the chemical compound is proceeded with a $P^-$, when a substance has been heavily doped with a P dopant the chemical compound is preceded with the notation $P^+$ and when a substance has been doped with an P dopant to a normal, or average level, the chemical compound is preceded with the notation P. In the following description, when an element in a chemical formula is listed in parenthesis, ( ), it indicates that the amount of that element in the compound can be varied, or the element can be removed, and still be within the scope of the present disclosure.

An aspect of an integrated circuit includes a varactor and a high electron mobility transistor (HEMT), wherein, the varactor and HEMT are fabricated with different material layers formed in the integrated circuit. The integrated circuit can further include a substrate and a buffer layer on the substrate. The varactor can include a $P^+$ GaN layer on a first portion of the buffer layer, a N GaN layer on a portion of the $P^+$ GaN, and a $N^+$ GaN layer on the N GaN layer. The varactor further includes a first contact coupled to a portion of the $P^+$ GaN layer, the first contact electrically isolated from the N GaN layer and a second contact coupled to the $N^+$ GaN layer. The HEMT includes a $N^-$ GaN layer on a second portion of the buffer layer and a $N^-$(In)Al(Ga)N layer on the $N^-$ GaN layer. The HEMT further includes a source ohmic contact and a drain ohmic contact, the source ohmic contact separated from the drain ohmic contact, and a gate electrically isolated from, and between, the source ohmic contact and drain ohmic contact. In one aspect the N GaN layer has a non-uniform doping profile. In addition, a $P^-$ GaN layer can be included between the $P^+$ GaN layer and the N doped GaN layer. In another example, a N InGaN layer can be included between the $N^-$ AlGaN layer and the source contact, drain contact, and gate. In an aspect the $N^-$ AlGaN layer can include indium (In).

In an aspect an RF module can include a HEMT configured to receive an RF signal and output an amplified RF signal, and a varactor configured to couple the amplified RF signal to a load, wherein the HEMT and varactor are integrated in the same die. The RF module can include a substrate and a buffer layer on the substrate. Wherein the varactor includes a $P^+$ GaN layer on a first portion of the buffer layer, a N GaN layer on a portion of the $P^+$ GaN, and a $N^+$ GaN layer on the N GaN layer. The varactor also includes a first contact coupled to a portion of the $P^+$ GaN layer, the first contact electrically isolated from the N GaN layer and a second contact coupled to the $N^+$ GaN layer. The HEMT includes a $N^-$ GaN layer on a second portion of the buffer layer and a $N^-$(In)Al(Ga)N layer on the $N^-$ GaN layer. The HEMT also includes a source ohmic contact and a drain ohmic contact, the source ohmic contact separated from the drain ohmic contact, and a gate electrically isolated from, and between, the source ohmic contact and drain ohmic contact.

In another aspect, the N"doped GaN layer can have a non-uniform doping profile. In another aspect, a $P^-$ GaN layer can be included between the $P^+$ GaN layer and the N GaN layer. In another aspect, a N InGaN layer can be included between the $N^-$ AlGaN layer and the source contact, drain contact, and gate. Additionally, the first and second $N^-$ AlGaN layers can include indium (In). In an aspect, the RF signal is a 5G RF signal. Also, the HEMT in the RF module can be included in an RF power amplifier.

In an aspect, a method of manufacturing a device with a varactor integrated with a HEMT includes forming a substrate, forming a buffer layer on the substrate, forming a $N^-$ GaN layer on the buffer, and forming a $N^-$ (In)Al(Ga)N layer on the $N^-$ GaN layer. Removing portions of the $N^-$ (In)Al (Ga)N and $N^-$ GaN layers in a region where the varactor will be formed, thereby exposing a portion of the buffer layer. Forming a $P^+$ GaN layer on the exposed buffer layer, forming a N GaN layer on the $P^+$ GaN layer, and forming a $N^+$ GaN layer on the N GaN layer. Forming a trench between the $P^+$ GaN, N GaN, and $N^+$ GaN layers and the $N^-$ GaN and $N^-$ (In)Al(Ga)N layers to isolate regions where the varactor and HEMT will be formed, respectively. Removing portions of the $N^+$ GaN layer and N GaN layer, exposing a portion of the $P^+$ GaN layer. Forming an ohmic contact on a portion of the exposed $P^+$ GaN layer, and forming an ohmic contact on the GaN layer, thereby forming the varactor. Forming a source and drain ohmic contacts on the $N^-$ (In)Al(Ga)N layer, and a gate on the $N^-$ (In)Al(Ga)N layer, the gate located between, and electrically isolated from, the source and drain contacts, thereby forming the HEMT.

In an aspect, the first $N^-$ GaN layer has a non-uniform doping profile. In an aspect, a $P^-$ GaN layer can be formed between the P⁺ GaN layer and the N⁻ GaN layer. In another aspect, a N InGaN layer can be formed between the N⁻ AlGaN layer and the source contact, drain contact, and gate.

Various aspect and features of the disclosure are described in further detail below.

BRIEF DESCRIPTION OF THE FIGURES

The accompanying drawings are presented to aid in the description and illustrations of embodiments and are not intended to be limitations thereof.

The drawings may not depict all components of a particular apparatus, structure, or method. Further, like reference numerals denote like features throughout the specification and figures.

DETAILED DESCRIPTION

Figure 1:
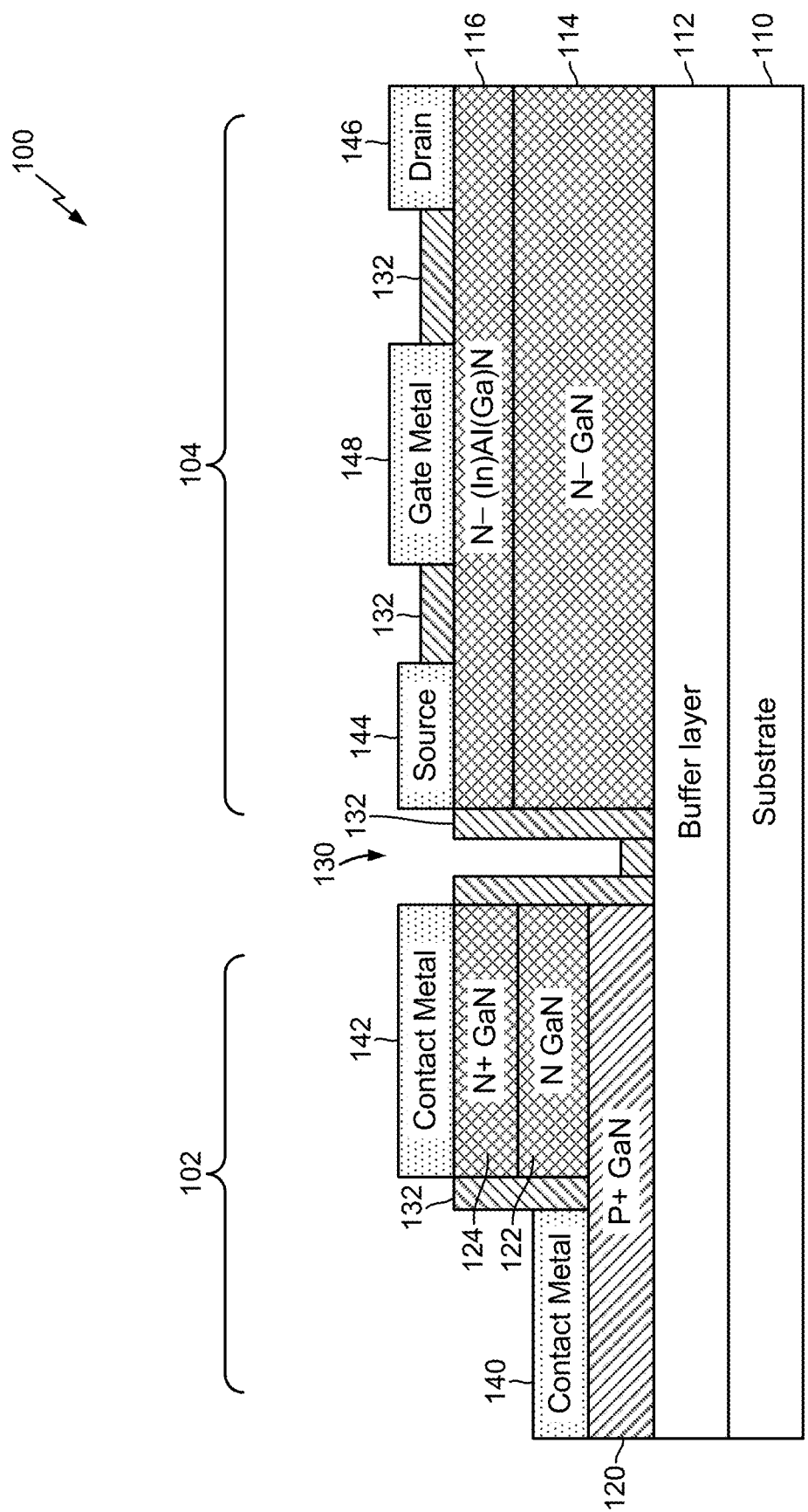
FIG. 1 is a diagram illustrating a vertical PN junction varactor integrated with a HEMT in the same device.

Aspects disclosed in the following description and related drawings are directed to specific aspects. Alternatives may be devised without departing from the scope of the invention. Additionally, well-known elements may not be described in detail, or may be omitted, so as not to obscure relevant details. Examples disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting Modern RF device, such as 5G devices, often include high electron mobility transistors (HEMT) to support the high frequency and high voltage of 5G RF signals. Gallium nitride (GaN) offers advantages over silicon (Si) and other III-V type materials due to its high electron peak velocity and high breakdown voltage. Thus, GaN is seeing increased use in 5G devices.

Typical RF devices, such as 5G devices, also include RF tuning circuits. For example, a 5G RF device may include a tuning circuit to match a power amplifier (PA) to an antenna, or a filter circuit that is tuned to a desired frequency. To accommodate different frequencies that are in a 5G signal, tuning circuits typically include capacitance tuning, such as a variable capacitor, or a varactor, that can be adjusted to accommodate a desired frequency, or frequency band, for a tuning device. With increased use of GaN HEMT in 5G devices it would be desirable to have a GaN varactor that can be integrated with a GaN HEMT in the same device or die. It would also be desirable for the GaN varactor to be able to have a wide tuning range and high breakdown voltage to support wideband, high power, 5G RF signals.

Current GaN varactors suffer from some limitations. For example, lateral GaN varactors typically have relatively small tuning range and low breakdown voltage. These characteristics make lateral varactors less desirable for 5G RF devices to support the very wideband and high power requirements of 5G signals. Another type of GaN varactor is a Schottky junction varactor, but these varactors suffer from large leakage current, thereby consuming large amounts of power making them undesirable for use in battery operated devices, such as mobile devices. Another type of varactor is a vertical N⁻N junction GaN varactor. Because these devices are N⁻N junction they have limited tuning range and breakdown voltage. Current GaN vertical varactors are also difficult to integrate with HEMT devices.

An improved vertical varactor is described below. The improved vertical varactor is a P⁻N junction varactor that can be fabricated with GaN or GaN/AlGaN material. As described below, the P⁻N junction varactor can be integrated with HEMT devices in a single device or die. The varactor and HEMT are fabricated with the different materials forming various layers of the varactor and HEMT. As described further below, using different material stack-up to form the varactor and HEMT allows optimization, or "tuning" of various characteristics of the varactor and HEMT. The integrated varactor and HEMT device may be used for RF circuits, such as RFFE devices for use in 5G. As noted above, in the following description, when a substance has been lightly doped with an N dopant the chemical compound is proceeded with a N⁻, when a substance has been heavily doped with a N dopant the chemical compound is preceded with the notation N⁺, and when a substance has been doped with an N dopant to a normal, or average level, the chemical compound is preceded with the notation N. Likewise, when a substance has been lightly doped with an P dopant the chemical compound is proceeded with a P⁻, when a substance has been heavily doped with a P dopant the chemical compound is preceded with the notation P⁺ and when a substance has been doped with an P dopant to a normal, or average level, the chemical compound is preceded with the notation P.

In one aspect, an integrated circuit includes a varactor and a high electron mobility transistor (HEMT). The varactor and HEMT can include different material layers formed in the integrated circuit.

FIG. 1 is a diagram illustrating a vertical P⁻N junction varactor 102 integrated with a HEMT 104 in the same device 100. As shown in FIG. 1, the device 100 can be an integrated circuit (IC) die. The device 100 includes a substrate 110. The substrate 110 can be silicon, Si, Silicon Carbon, SiC, Aluminum Oxide, $Al_2O_3$, or other material. A buffer layer 112, such as a GaN or AlN layer, is formed on the substrate 110.

A N⁻ GaN layer 114 is formed on the buffer layer 112 in a region where the HEMT 104 will be formed. A N⁻ (In)Al(Ga)N layer 116 is formed on the N⁻ GaN layer 114. The N⁻ GaN layer 114 and N⁻ (In)Al(Ga)N layer 116 form layers of the HEMT. It is noted that when an element is listed in parenthesis, ( ) in a chemical formula, it indicates that the amount of that element in the compound can be varied, or the element can be removed, and still be within the scope of the present disclosure.

A P⁺ GaN layer 120 is formed on the buffer layer 112 in a region where the varactor 104 will be formed. A N GaN 122 layer is formed on a portion of the P⁺ GaN layer 120. A N⁺ GaN 124 layer is formed on the N GaN layer 122. The P⁺ GaN layer 120, N GaN layer 122, and N⁺ GaN layer 124 form layers of the varactor 102.

A trench 130 between the layers of the HEMT 104 and the varactor 102 isolates the varactor 102 from the HEMT 104. A dielectric layer 132, such as SiO, SiN, AlO, or other type of dielectric material, is formed on the sidewalls and bottom of the trench 130. The dielectric material 132 is also formed on a side of the varactor 102 opposite the trench 130 and on portions of a top surface of the HEMT 104. A first contact 140 of the varactor 102 is coupled to the P⁺ GaN layer 120, and a second contact 142 of the varactor 102 is coupled to the N⁺ GaN layer 124. The first contact 140 forms the P contact and the second contact 142 forms the N contact for the P⁻N varactor 102.

A source contact 144, a drain contact 146 and a gate contact 148 between the source contact 144 and drain contact 146, are formed on the N⁻ (In)Al(Ga)N layer 116, thereby forming the HEMT 104.

As shown in FIG. 1, and described further below, the varactor 102 is integrated in the same die 100 as the HEMT 104. However, the varactor 102 and HEMT 104 are fabricated from different stack ups of material layers. Having the varactor 102 and HEMT 104 made with different materials allows increased flexibility in optimizing performance characteristics of the varactor 102 and HEMT 104.

While FIG. 1 shows a particular stack of materials to form the varactor 102 and a different particular stack of material to form the HEMT 104, other material combinations can be used to obtain desired characteristics of the varactor 102 and HEMT 104. For example, various materials, doping levels, and doping profiles, such as non-uniform doping profiles, can be used in both the N and P layers of the varactor 102 to obtain a large capacitance tuning range, low leakage, and high linearity for the varactor 102. Likewise, various materials, doping levels, and doping profiles, such as non-uniform doping profiles, can be used in the layers of the HEMT 104 to optimize performance characteristics of the HEMT 104. Varying the materials used to form the varactor 102 and HEMT 104 and integrating the varactor 102 and HEMT 104 in the same device or die, can be used in various applications, for example, an RF module including an RF power amplifier and tuning circuit to match a load. The integrated varactor 102 and HEMT 104 can be used in RF devices, such as 5G RF devices, to transmit and/or receive 5G RF signals.

Figure 2:
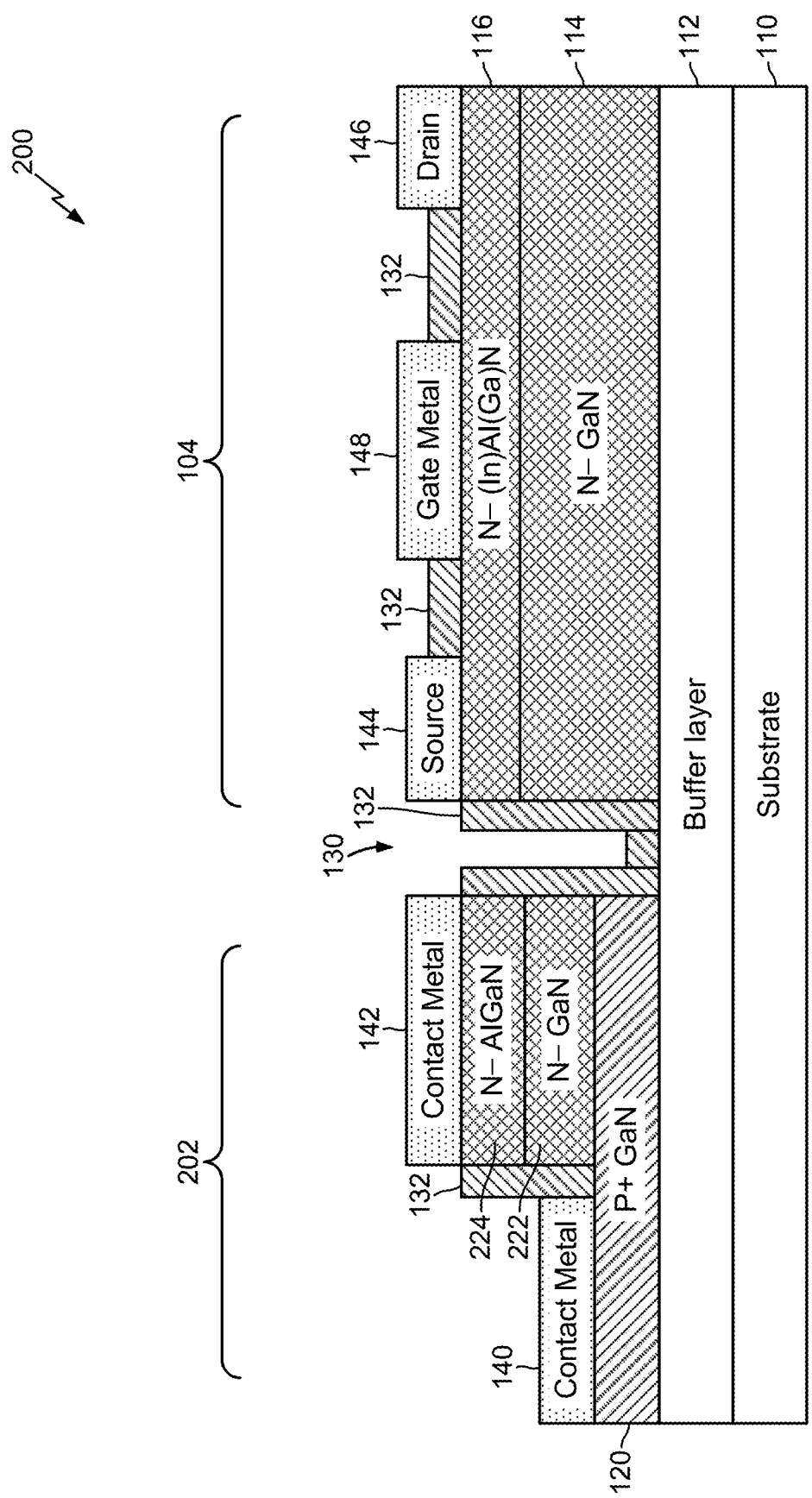
FIG. 2 is a diagram illustrating another example of a vertical PN junction varactor integrated with a HEMT.

FIG. 2 is a diagram illustrating another example of a vertical P⁻N junction varactor 202 integrated with a HEMT 104 in the same device 200. The device illustrated in FIG. 2 is similar to the device illustrated in FIG. 1 with the N GaN 122 layer and GaN layer 124 replaced with N⁻ AlGaN layer 224 and N⁻ GaN layer 222 to make layers of the varactor 202. The layers of the HEMT 104 in FIG. 2 are similar to the layers of the HEMT 104 illustrated in FIG. 1. Using the N⁻ GaN layer 222 and N⁻ AlGaN layer 224 to make the varactor 202 adjusts the tuning range and breakdown voltage of the vertical varactors 202 to desired levels.

Figure 3:
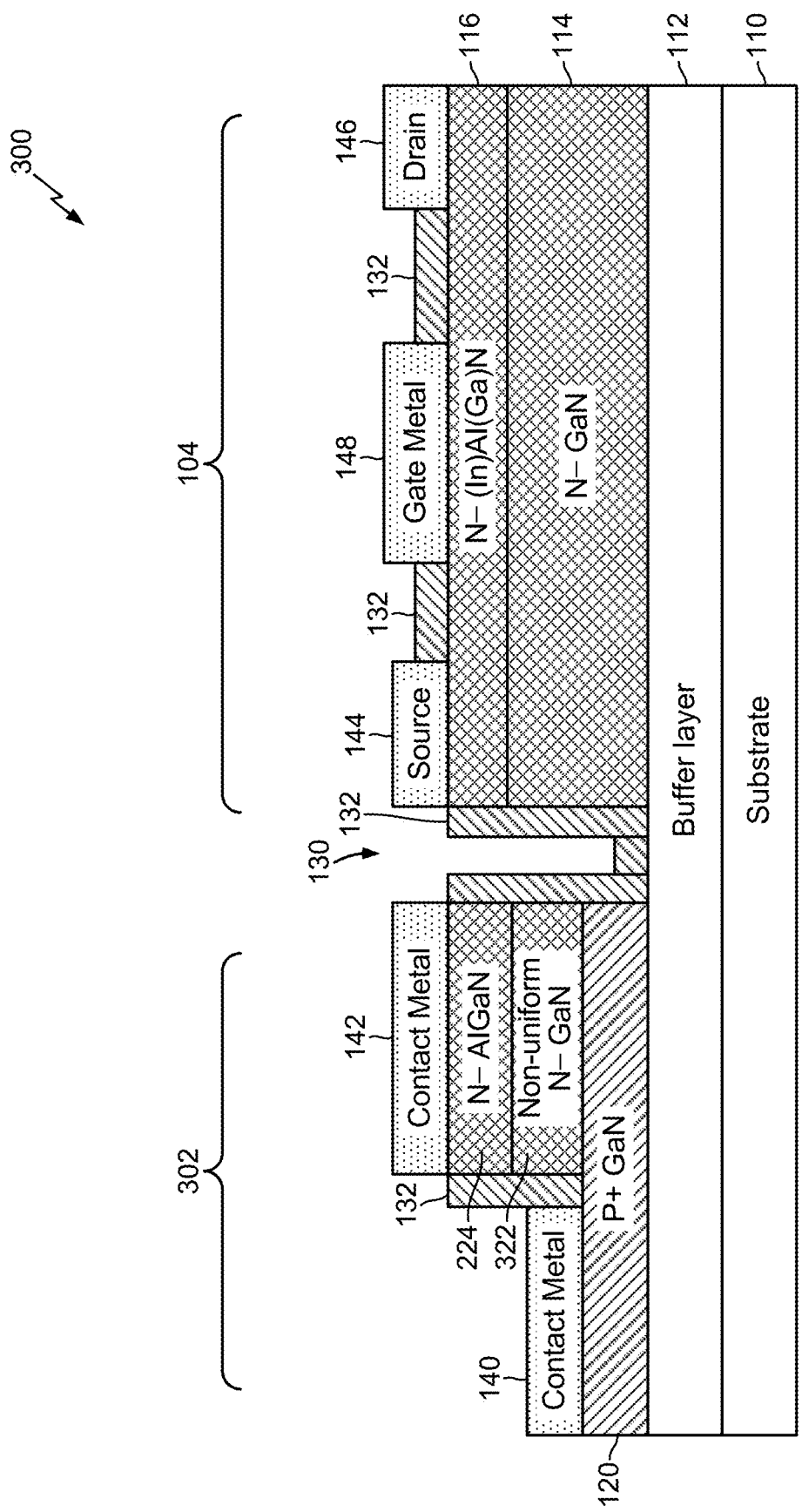
FIG. 3 is a diagram illustrating another example of a vertical PN junction varactor integrated with a HEMT.

FIG. 3 is a diagram illustrating another example of a vertical P⁻N junction varactor 302 that may be integrated with a HEMT 104. The device 300 illustrated in FIG. 3 is similar to the device illustrated in FIG. 2 but having a N⁻ GaN layer 322 with a non-uniform doping profile instead of a uniform doping profile. The non-uniform doping profile of the GaN layer 322 adjusts the tuning range and breakdown voltage of the vertical varactors 302 to desired levels.

Figure 4:
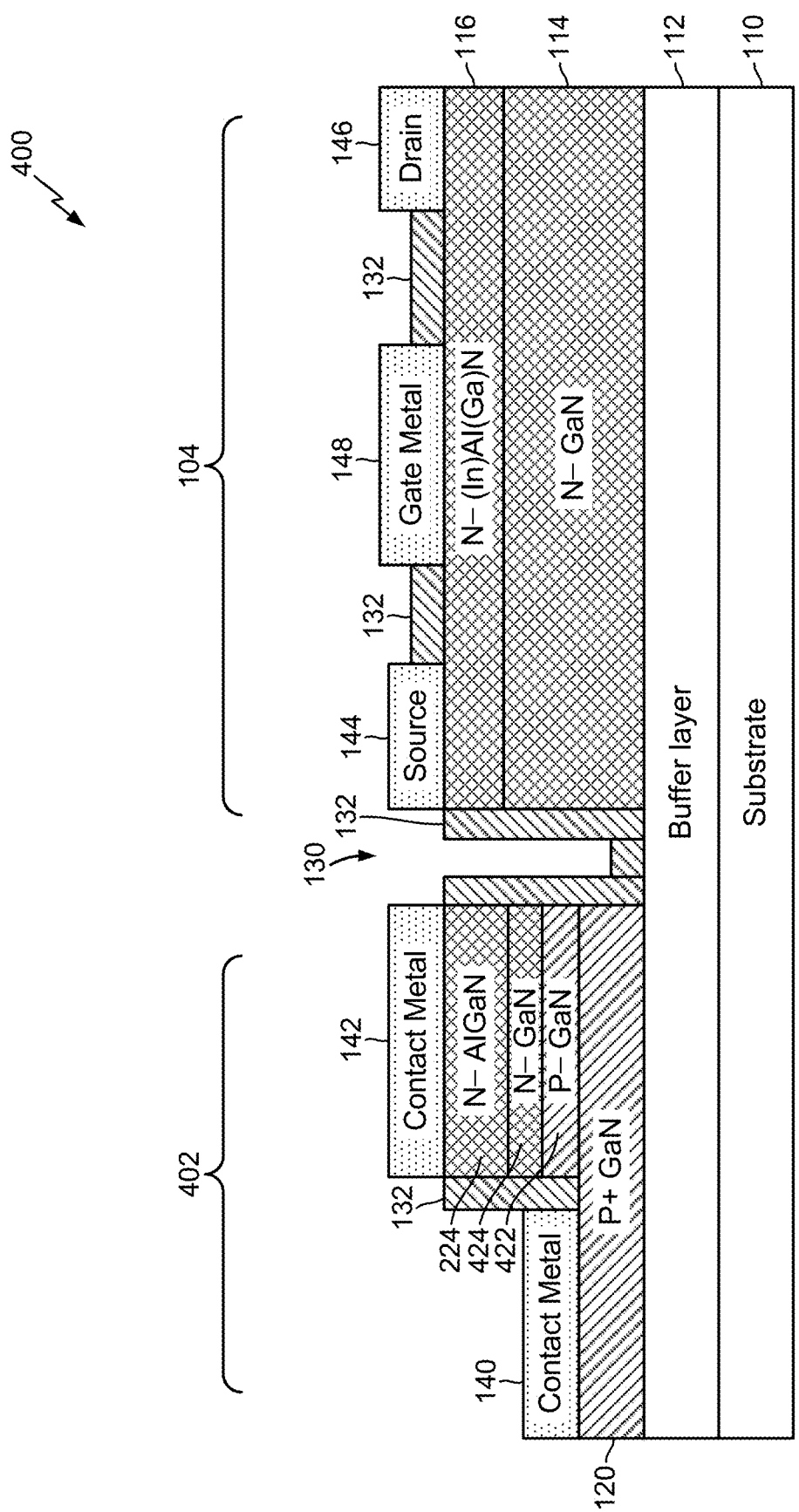
FIG. 4 is a diagram illustrating another example of a vertical PN junction varactor integrated with a HEMT.

FIG. 4 is a diagram illustrating another example of a vertical P⁻N junction varactor 402 integrated with a HEMT 104. The device 400 illustrated in FIG. 4 is similar to the device illustrated in FIG. 2 but the N⁻ GaN layer 222 of the varactor 402 is changed to a P⁻ GaN layer 422 and a N⁻ GaN layer 424. The P⁻ GaN layer 422 and a N⁻ GaN layer 424 adjust the tuning range and breakdown voltage of the vertical varactors 302 to desired levels.

Figure 5:
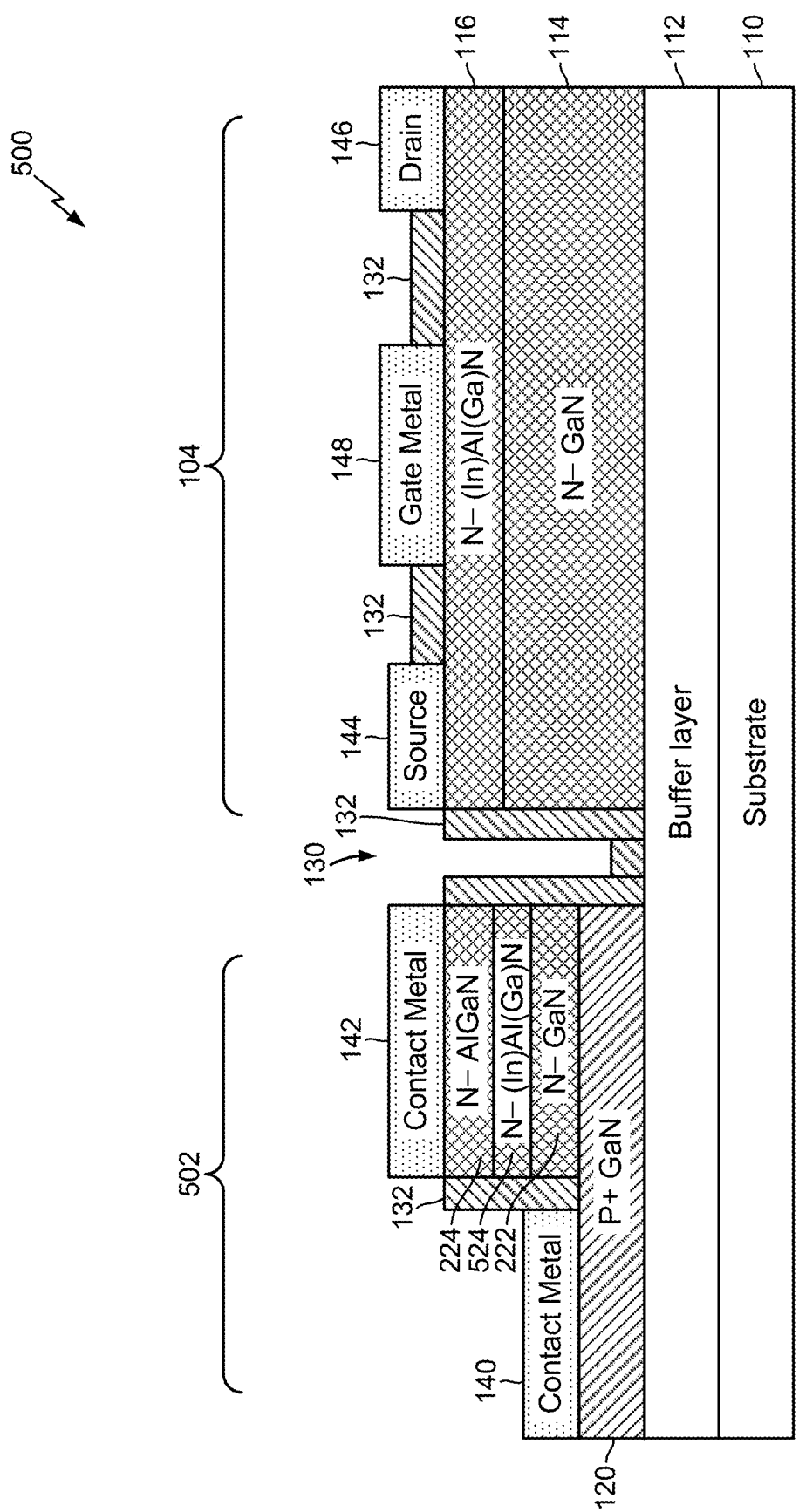
FIG. 5 is a diagram illustrating another example of a vertical PN junction varactor 502 integrated with a HEMT 104.

FIG. 5 is a diagram illustrating another example of a vertical P⁻ N junction varactor 502 integrated with a HEMT 104. The device 500 illustrated in FIG. 5 is similar to the device illustrated in FIG. 2 with a N⁻ (In)Al(Ga)N layer 524 inserted between the N⁻ GaN layer 222 and the N⁻ AlGaN layer 224 of the varactor 502. The N⁻ (In)Al(Ga)N layer 524 adjust the tuning range and breakdown voltage of the vertical varactors 302 to desired levels.

While the examples illustrated in FIGS. 1-5 illustrate various examples on different materials used to form the varactor, other combinations are possible. In addition, the examples illustrated show different materials used to form the varactor, in other examples different materials may be used to for the HEMT to optimize, or "tune" various characteristics of the HEMT.

FIGS. 6A-6F illustrate a series of exemplary operations for fabricating an integrated varactor and HEMT device according to at least one aspect of the disclosure. The example illustrated in FIGS. 6A-6F illustrate exemplary operation for fabricating the integrated varactor HEMT device 100 of FIG. 1.

Figure 6A:
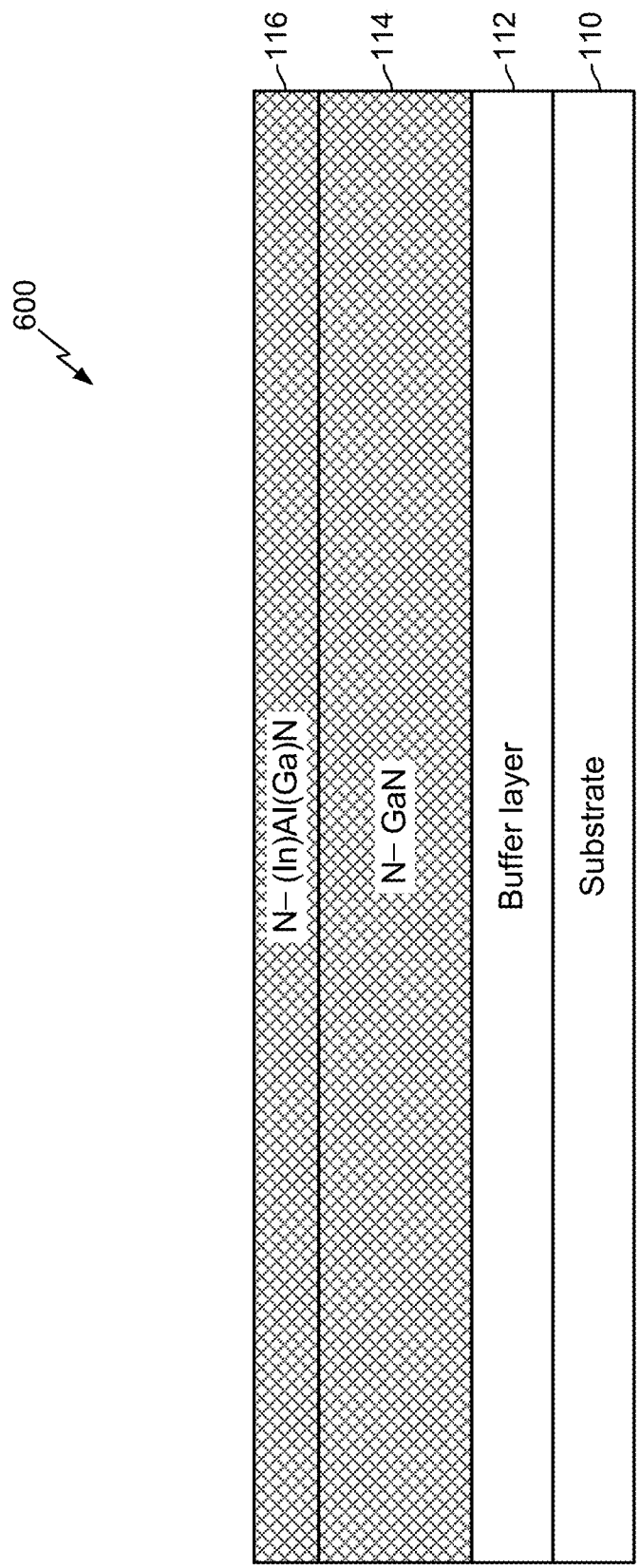
FIGS. 6A-6F illustrate a series of exemplary operations for fabricating an integrated varactor and HEMT device according to at least one aspect of the disclosure.

In the fabrication operation illustrated in FIG. 6A, a wafer 600 is formed. In one example, the wafer 600 can be a HEMT epitaxial wafer. The wafer 600 can include a substrate 110. The substrate can be, for example, a silicon (Si), Silicon Carbon (SiC), Aluminum Oxide (Al₂O₃), or other material. A buffer layer 112, such as a GaN/AlN layer, is formed on the substrate 110. An N⁻ GaN layer 114 is formed on the buffer layer 112. An N⁻ (In)Al(Ga)N layer 116 is formed on the N⁻ GaN layer 114. It is noted that other materials may be used to form the wafer 600.

Figure 6B:
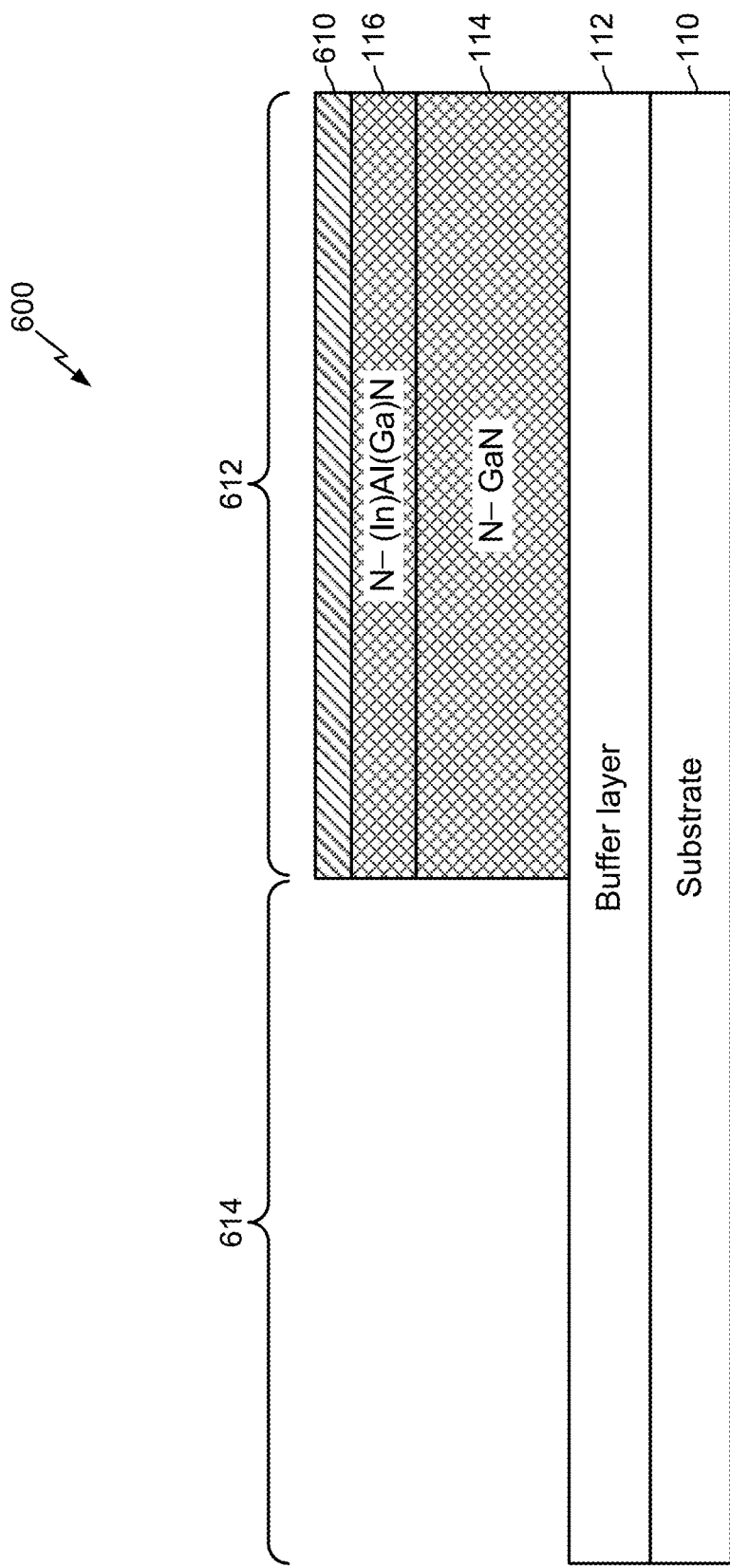

In the fabrication operation illustrated in FIG. 6B, a dielectric material 610 is formed on a portion 612 of the HEMT epitaxial wafer 600 where a HEMT will be formed. The dielectric material 610 can be SiO, SiN, AlO, or other type of dielectric material. Using the dielectric layer 610 as a mask, a portion of the N⁻ (In)Al(Ga)N layer 116 and a portion of the N⁻ GaN layer 114 are removed from a region 614 of the HEMT epitaxial wafer 600 where a varactor will be formed.

Figure 6C:
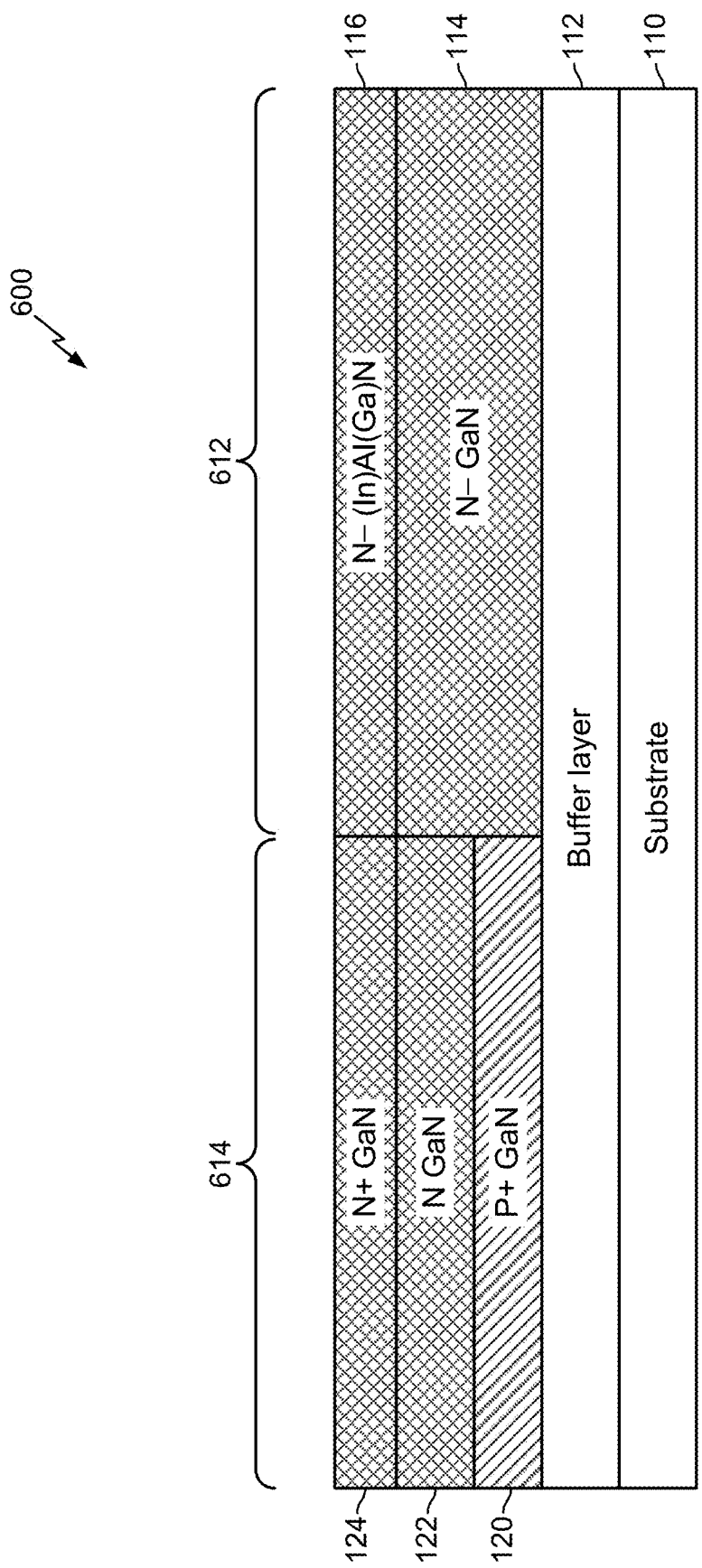

In the fabrication operation illustrated in FIG. 6C an epitaxial regrowth forms a P⁺ GaN layer 120 on the buffer layer 112 in the region 614 of the wafer 600 where the varactor will be formed. In another example, a P⁻ GaN layer may be used. An N GaN layer 122 is formed on the P⁺ GaN layer 120. The N GaN layer 122 doping profile may be uniform or non-uniform. An N⁺ GaN layer 124 is formed on the N GaN layer 122.

In another example, an N⁺ GaN layer 124 can be formed on the buffer layer 112. A N GaN layer 122 may be formed on the N⁺ GaN layer 124 with a P⁺ GaN layer 120 formed on the N GaN layer 122.

After the layers of the varactor have been formed the dielectric layer 610 is removed from the region 612 of the wafer 600 where the HMET will be formed.

Figure 6D:
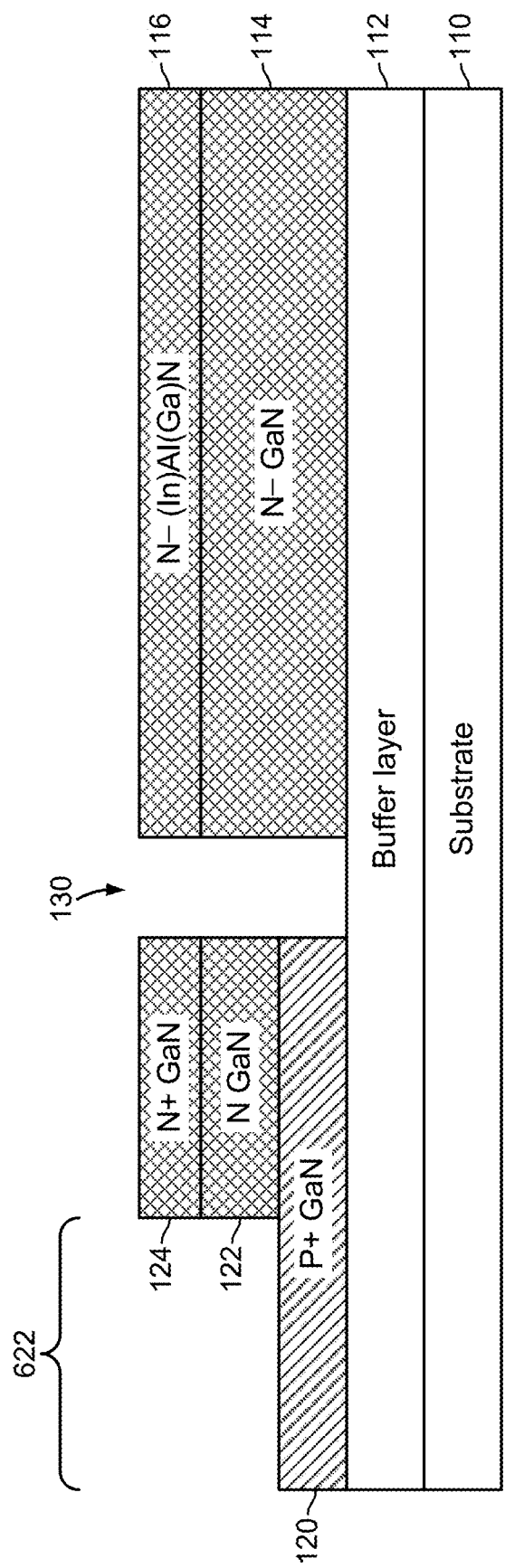

In the fabrication operation illustrated in FIG. 6D a trench 130 is formed between the HEMT and the varactor. A region 622 of the P+ GaN layer 120, N GaN layer 122 and N+ GaN layer 124 of the varactor are also removed. The trench and portion of the layers of the varactor can be removed in multiple ways, such as etching, laser ablation, or other.

Figure 6E:
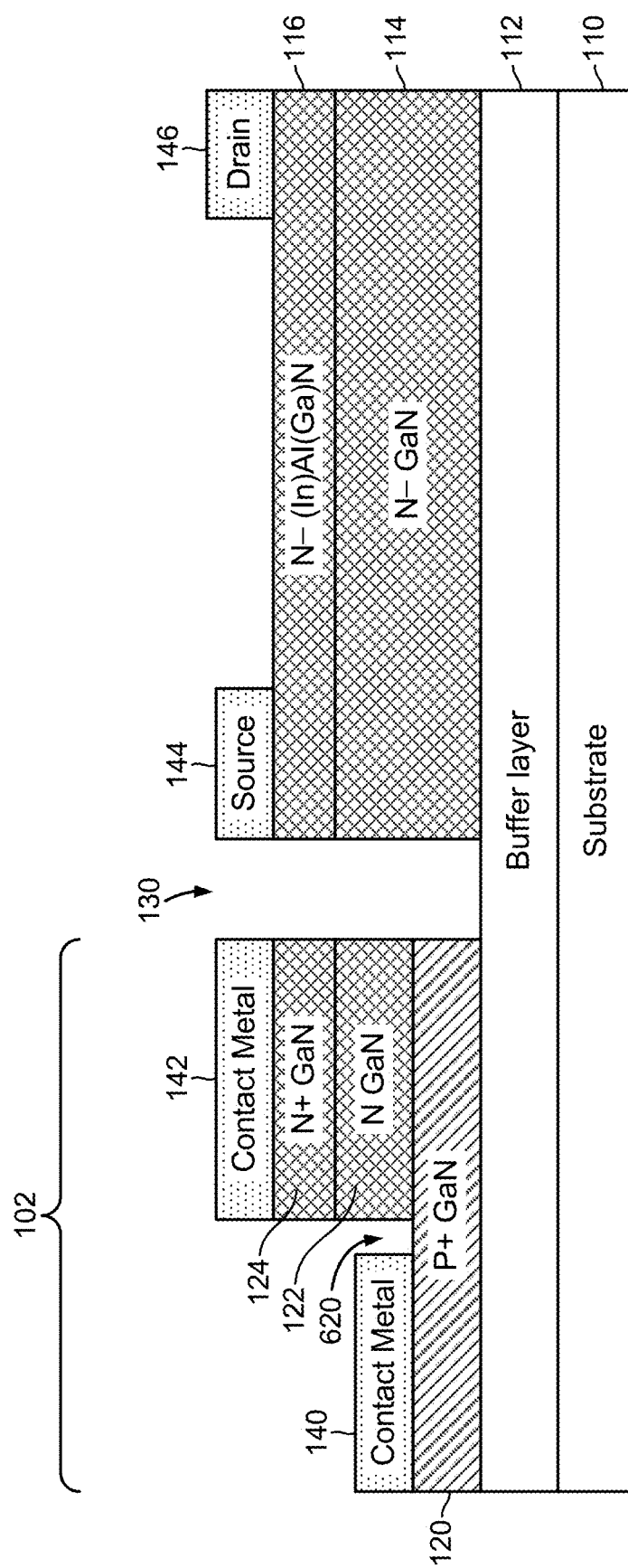

In the fabrication operation illustrated in FIG. 6E a first ohmic contact 140 is formed on the exposed P+ GaN layer 120, and a second ohmic contact 142 is formed on the N+ GaN layer 124 thereby forming the varactor 102. A gap, or opening, 630 is formed between the first ohmic contact 140 and the N GaN layer 122 of the varactor. The first ohmic contact 140 is the P connection and the second ohmic contact 142 is the N connection of the P⁻N varactor 102.

A source ohmic contact 144 and drain ohmic contact 146 are formed on the N" (In)Al(Ga)N layer 116. The source ohmic contact 144 and drain ohmic contact 146 are separated from each other.

Figure 6F:
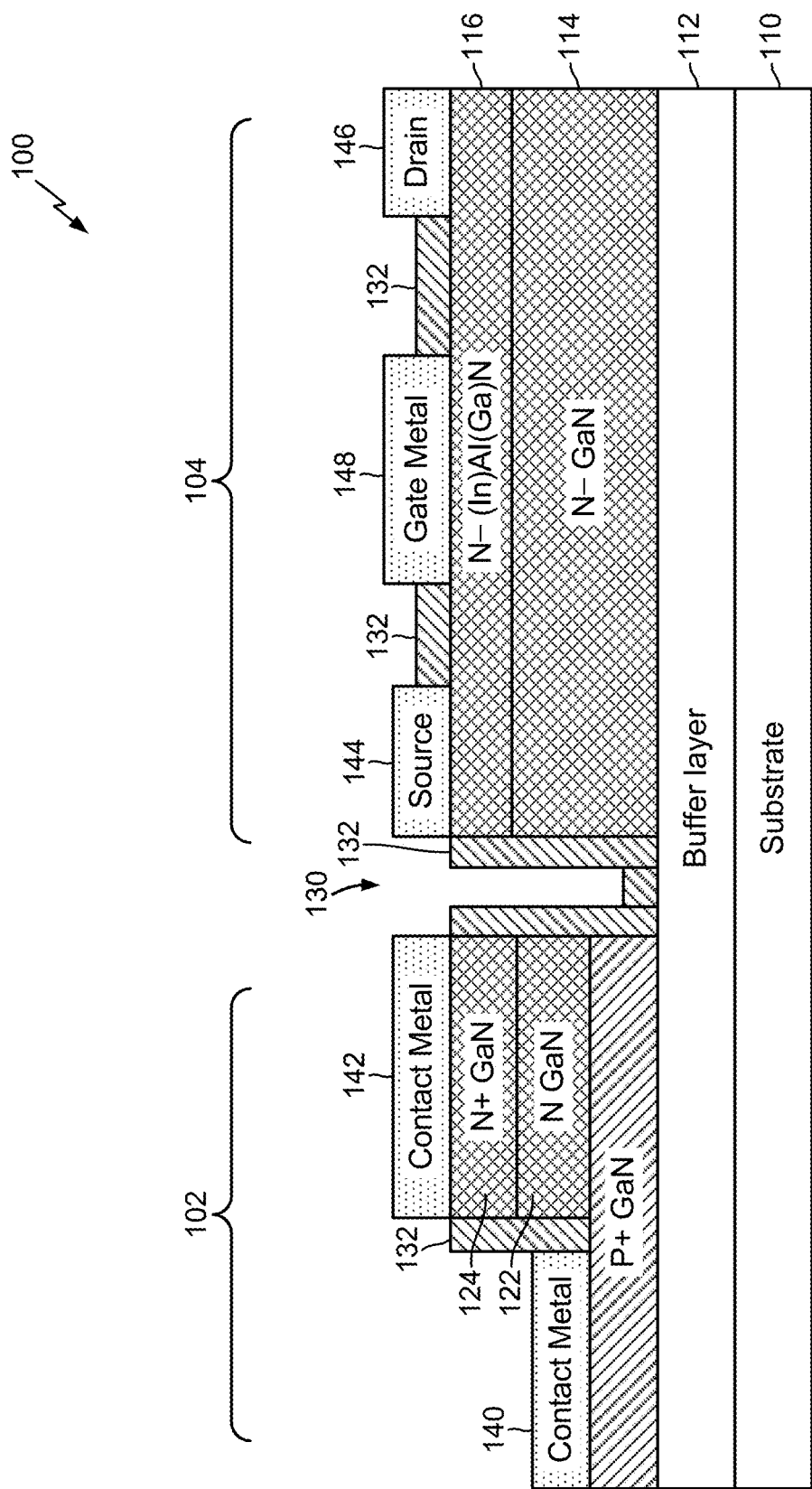

In the fabrication operation illustrated in FIG. 6F a gate 148 of the HEMT is formed. The gate 148 is located between the source ohmic contact 144 and the drain ohmic contact 146 thereby forming the HEMT 104. A dielectric layer 132 is formed over select portions of the varactor 102 and HEMT 104, as shown, leaving the first, second, source, drain, and gate contacts 140, 142, 144, 146, and 148 exposed. The dielectric layer helps to protect the integrated varactor HEMT device 100.

As illustrated in FIGS. 6A-6F, the varactor 102 and HEMT 104 are fabricated from different material layer stack up which can provide flexibility in optimizing the performance of the varactor 102 and HEMT 104 in the integrated device 100. While the example illustrated in FIGS. 6A-6F only illustrate a varactor 102 and HEMT 104 devices, other devices can also be integrated in the device 100.

The operations in FIGS. 6A-6F can be performed in different order. For example, the dielectric layer 122 in FIG. 6F can be formed before the ohmic contacts in FIG. 6E are formed. In this example, after the dielectric layer 122 is formed, openings can be made in the dielectric layer 122, for example by etching, and then ohmic contacts are formed in the openings in the dielectric.

Figure 7:
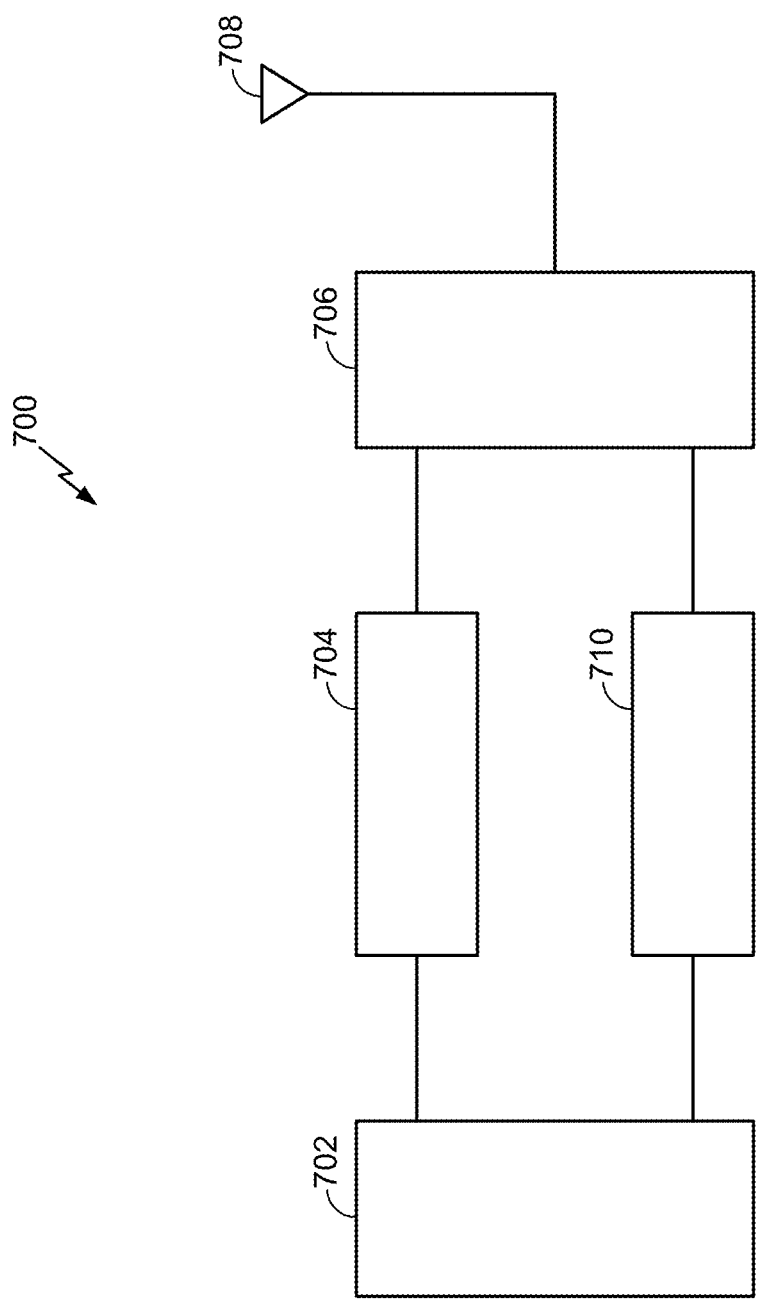
FIG. 7 illustrates an RF module that may include a varactor integrated with a HEMT in the same device.

FIG. 7 illustrates an RF module 700 that may include the integrated varactor and HEMT described above. The RF module 700 may be used to transmit and/or receive RF signals, such as 5G RF signals. The RF module 700 includes a transceiver 702 coupled to a power amplifier 704. The power amplifier 704 is coupled to a duplexer 706 that is coupled to an antenna 708. The RF module 700 also includes receive circuitry 710 that is coupled to the duplexer 706 and the transceiver 702. For clarity, other components of the RFR module 700 are not shown.

When the RF module 700 is used to transmit data, the transceiver 702 receives a data signal and creates an RF signal which is amplifier by the power amplifier 704 to a desired power level for transmission. The power amplifier 704 output is coupled to the duplexer 706 that routs the power amplifier output to the antenna 708 for transmission. The power amplifier 704 may include an integrated HEMT and varactor device as described above. The HEMT can be used to amplify the RF signal and the varactor can be used to optimize matching circuitry to efficiently couple the power amplifier to the duplexer 706 antenna 708 combined load seen by the power amplifier 704.

When the RF module 700 is used to receive data, and RF signal from the antenna 708 is coupled through the duplexer 706 to the receive circuitry 710. An output of the receive circuitry 710 is coupled to the transceiver 302. The receive circuitry 710 may include an integrated HEMT and varactor device as described above. The varactor can be used to efficiently couple the receive circuit 710 to the duplexer 706 antenna 708 combination. A varactor may also tune the receive circuitry 710 to a desired frequency band. Also, the HEMT may amplify the received RF signal before the signal is sent to the transceiver 702.

Figure 8:
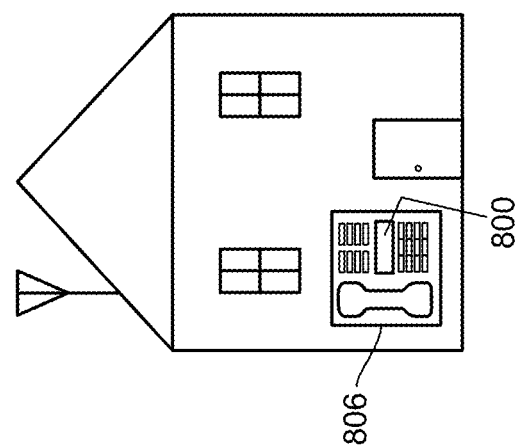
FIG. 8 illustrates various electronic devices that may be include a varactor integrated with a HEMT in the same device.
Figure 8:
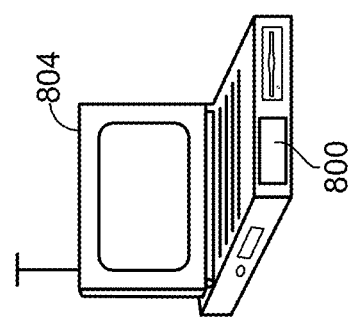
Figure 8:
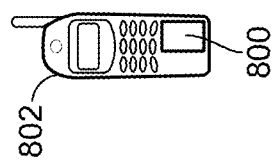

FIG. 8 illustrates various electronic devices that may be include a varactor integrated with a HEMT, such as the RF module 700, described above. For example, a mobile phone device 802, a laptop computer device 804, a terminal device 806 as well as wearable devices, portable systems, that require small form factor, extreme low profile, may include an apparatus 800 that incorporates the devices/systems as described herein. The apparatus 800 may be, for example, any of the integrated circuits, dies, integrated devices, integrated device packages, integrated circuit devices, device packages, integrated circuit (IC) packages, package-on-package devices, system-in-package devices described herein. The devices 802, 804, 806 illustrated in FIG. 8 are merely exemplary. Other electronic devices may also feature the apparatus 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

While the above describes a single HEMT and varactor integrated in a single device of die, in other aspects there can be multiple HEMTs and varactors, and different numbers of, HEMTs and varactors may be integrated in a single device or die. In addition, other compounds may be integrated onto the same device or die with the HEMT and varactor.

The various illustrative logical blocks, modules, and circuits described in connection with the aspects disclosed herein may be implemented or performed in an integrated circuit (IC), a system on a chip (SoC), an Application Specific Integrated Circuit (ASIC), or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit comprising:
a substrate;
a buffer layer on the substrate;
a varactor on a first portion of the buffer layer, the varactor comprising:
   a gallium nitride (GaN) layer doped with a P-type dopant ($P^+$ GaN layer) on the first portion of the buffer layer;
   a stack of layers on the $P^+$ GaN layer, the stack of layers comprising:
      a first layer comprising a first material comprising a GaN compound, the first material doped to a first concentration of N-type dopant; and
      a second layer comprising a second material comprising a GaN compound, the second material doped to a second concentration of the N-type dopant;
   a first contact coupled to a portion of the $P^+$ GaN layer, the first contact electrically isolated from the stack of layers; and
   a second contact coupled to the second layer; and
a high electron mobility transistor (HEMT) on a second portion of the buffer layer, the HEMT comprising:
   an $N^-$ GaN layer on the second portion of the buffer layer;
   an $N^-$(In)Al(Ga)N layer on the $N^-$ GaN layer;
   a source ohmic contact and a drain ohmic contact on the $N^-$(In)Al(Ga)N layer, the source ohmic contact separated from the drain ohmic contact; and
   a gate on the $N^-$(In)Al(Ga)N layer, the gate electrically isolated from, and between, the source ohmic contact and drain ohmic contact.

2. The integrated circuit of claim 1, wherein at least one of the first concentration and the second concentration comprises a non-uniform doping profile.

3. The integrated circuit of claim 1, further comprising:
a $P^-$ GaN layer between the $P^+$ GaN layer and the first layer.

4. A radio frequency (RF) module comprising:
a high electron mobility transistor (HEMT) and a varactor on a die, wherein:
   the HEMT is configured to receive an RF signal and output an amplified RF signal;
   the varactor is configured to couple the amplified RF signal to a load; and
   the die further comprises:
      a substrate;
      a buffer layer on the substrate;
      the varactor on a first portion of the buffer layer, the varactor comprising:
         a gallium nitride (GaN) layer doped with a P-type dopant ($P^+$ GaN layer) on the first portion of the buffer layer;
         a stack of layers on the $P^+$ GaN layer, the stack of layers comprising:
            a first layer comprising a first material comprising a GaN compound, the first material doped to a first concentration of N-type dopant; and
            a second layer comprising a second material comprising a GaN compound, the second material doped to a second concentration of the N-type dopant;
         a first contact coupled to a portion of the P+ GaN layer, the first contact electrically isolated from the stack of layers; and
         a second contact coupled to the second layer; and
      the HEMT on a second portion of the buffer layer, the HEMT comprising:
         an $N^-$ GaN layer on the second portion of the buffer layer;
         an $N^-$(In)Al(Ga)N layer on the $N^-$ GaN layer;
         a source ohmic contact and a drain ohmic contact on the $N^-$ (In)Al(Ga)N layer, the source ohmic contact separated from the drain ohmic contact; and
         a gate on the $N^-$(In)Al(Ga)N layer, the gate electrically isolated from, and between, the source ohmic contact and drain ohmic contact.

5. The RF module of claim 4, wherein at least one of the first concentration and the second concentration comprises a non-uniform doping profile.

6. The RF module of claim 4, further comprising:
a $P^-$ GaN layer between the $P^+$ GaN layer and the first layer.

7. The RF module of claim 4, wherein the RF signal is a 5G RF signal.

8. The RF module of claim 4, wherein the HEMT is included in an RF power amplifier.

9. A method of manufacturing a device with a varactor integrated with a high electron mobility transistor (HEMT), the method comprising:
forming a substrate;
forming a buffer layer on the substrate;
forming an $N^-$ GaN layer on the buffer layer;
forming an $N^-$ (In)Al(Ga)N layer on the $N^-$ GaN layer;
removing portions of the $N^-$ (In)Al(Ga)N layer and the $N^-$ GaN layer in a region where the varactor will be formed, thereby exposing a portion of the buffer layer;
forming a $P^+$ GaN layer on the exposed portion of the buffer layer;
forming an N GaN layer on the $P^+$ GaN layer;
forming an $N^+$ GaN layer on the N GaN layer;
forming a trench between the $P^+$ GaN, N GaN, and $N^+$ GaN layers and the $N^-$ GaN and $N^-$ (In)Al(Ga)N layers to isolate regions where the varactor and the HEMT will be formed, respectively;
removing portions of the $N^+$ GaN layer and the N GaN layer, exposing a portion of the $P^+$ GaN layer;
forming an ohmic contact on a portion of the exposed portion of the $P^+$ GaN layer, and forming an ohmic contact on the $N^+$ GaN layer, thereby forming the varactor; and
forming source and drain ohmic contacts on the $N^-$ (In)Al(Ga)N layer, and a gate on the $N^-$ (In)Al(Ga)N layer, the gate located between, and electrically isolated from, the source and drain ohmic contacts, thereby forming the HEMT.

10. The method of claim 9, wherein the N GaN layer has a non-uniform doping profile.

11. The method of claim 9, further comprising:
forming a $P^-$ GaN layer between the $P^+$ GaN layer and the N GaN layer.

12. The integrated circuit of claim 1, wherein:
the first layer is on the $P^+$ GaN layer and the first material comprises GaN and the N-type dopant;
the second layer is on the first layer and the second material comprises GaN and the N-type dopant; and
the second concentration of the N-type dopant is higher than the first concentration of the N-type dopant.

13. The integrated circuit of claim 1, wherein:
the first layer is on the $P^+$ GaN layer and the first material comprises GaN and the N-type dopant; and the second layer is on the first layer and the second material comprises aluminum gallium nitride (AlGaN) and the N-type dopant.

14. The integrated circuit of claim 1, wherein:

the first layer is on the $P^+$ GaN layer and the first material comprises GaN and the N-type dopant;

the second layer is on the first layer and the second material comprises aluminum gallium nitride (AlGaN); and the first concentration of the N-type dopant has a non-uniform profile.

15. The integrated circuit of claim 1, wherein:

the stack of layers further comprises a second GaN layer doped with the P-type dopant ($P^-$ GaN layer);

the $P^-$ GaN layer is on the $P^+$ GaN layer;

the first layer is on the $P^-$ GaN layer and the first material comprises GaN and the N-type dopant; and the second layer is on the first layer and the second material comprises aluminum gallium nitride (AlGaN) and the N-type dopant.

16. The integrated circuit of claim 1, wherein:

the stack of layers further comprises a third layer comprising a third material comprising aluminum (Al) and Nitrogen (N) doped with the N-type dopant;

the first layer is on the $P^+$ GaN layer and the first material comprises GaN and the N-type dopant;

the third layer is on the first layer; and the second layer is on the third layer and the second material comprises aluminum gallium nitride (AlGaN) and the N-type dopant.

* * * * *